United States Patent [19]

Ozaki et al.

[11] Patent Number: 4,800,527
[45] Date of Patent: Jan. 24, 1989

[54] SEMICONDUCTOR MEMORY DEVICE

[75] Inventors: Masaharu Ozaki, Yokohama; Takao Yonehara, Atsugi, both of Japan

[73] Assignee: Canon Kabushiki Kaisha, Tokyo, Japan

[21] Appl. No.: 111,588

[22] Filed: Oct. 23, 1987

[30] Foreign Application Priority Data

Nov. 7, 1986 [JP] Japan .................................. 61-264026

[51] Int. Cl.⁴ ...................... G11C 13/00; G11C 11/24
[52] U.S. Cl. ................................... 365/182; 357/23.6; 361/277; 365/149
[58] Field of Search ............... 365/149, 150, 174, 182; 361/271, 277; 357/23.6

[56] References Cited

U.S. PATENT DOCUMENTS 4,721,987  1/1988  Baglee et al. ...................... 365/149

Primary Examiner—Terrell W. Fears
Attorney, Agent, or Firm—Fitzpatrick, Cella, Harper & Scinto

[57] ABSTRACT

A semiconductor memory device comprises: a charge holding capacitor formed on a semiconductor substrate; an insulating layer formed on the capacitor; and a transistor formed on a monocrystalline or substantially monocrystalline semiconductor layer, which is provided by forming, on the insulating layer, a hetero material of a nucleation density sufficiently higher than that of the insulating layer and of a size smaller enough to allow growth of a single nucleus of a semiconductor layer, followed by crystal growth around a single nucleus formed on the hetero material.

1 Claim, 5 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device having a charge holding capacitor and a transistor.

2. Related Background Art

Semiconductor memory devices have recently shown a remarkable progress in the memory capacity, principally owing to a fine manufacturing technology.

For example, in a semiconductor memory device having charge holding capacitors and MOS transistors functioning as selector switches, the higher integration has been achieved by compactization of said capacitors and said MOS transistors. However, such charge holding capacitor has a lower limit in the capacity thereof, because a soft error by alpha ray becomes a serious problem. Also the size reduction of the MOS transistors is not easy because of miniaturization technology, performance etc. and has been an obstacle in achieving a higher degree of integration.

In such semiconductor memory device, for reducing the size of the capacitor without reducing the capacity thereof, there has been developed, for example, a method of forming a trench on a silicon substrate and forming the capacitor utilizing the walls of said trench. However in such conventional methods in which the capacitor and the MOS transistor are positioned in a planar structure, the memory cell size is inevitably equal to the sum of the areas of said capacitor and of said MOS transistor, and the degree of integration has therefore approaching to its upper limit.

SUMMARY OF THE INVENTION

The object of the present invention is to provide a semiconductor memory device in which the degree of integration is significantly improved by forming MOS transistors on the charge holding capacitor across an insulating layer.

The above-mentioned object can be achieved, according to the present invention, by a semiconductor memory device comprising a charge holding capacitor formed on a semiconductor substrate, an insulating layer formed on said capacitor, and a transistor formed in a monocrystalline or substantially monocrystalline semiconductor layer, which is provided by forming, on said insulating layer, a different material of a nucleation density sufficiently higher than that of said insulating layer and of a size small enough to allow growth of a single nucleus of a semiconductor material, followed by a crystal growth around a single nucleus formed on said different material. In this manner the degree of integration can be significantly improved by forming an insulating layer on the capacitor and forming a transistor on said layer.

The process steps required for forming the monocrystalline or substantially monocrystalline semiconductor layer on said insulating layer are not special ones but are same as those known in the ordinary semiconductor process, as will be explained later.

DETAILED DESCRIPTION OF THE PREFERRED EMBODIMENTS

Now the present invention will be clarified in detail by embodiments thereof shown in the attached drawings.

Figure 1:
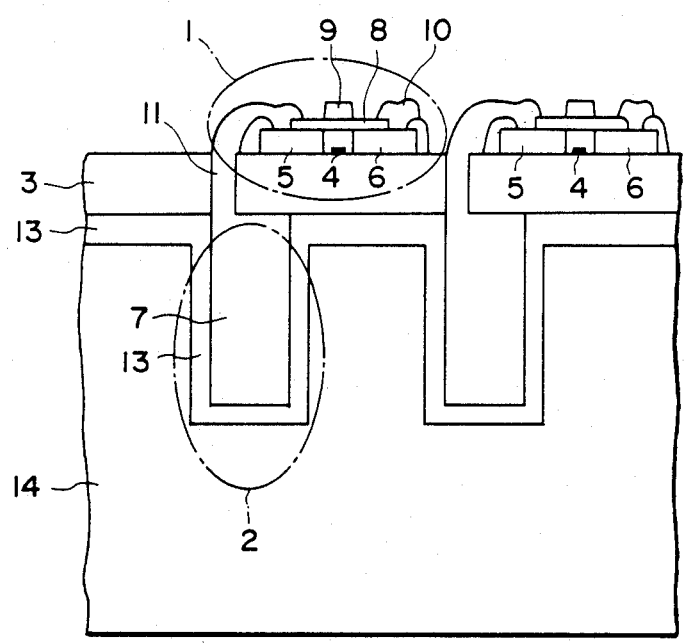
FIG. 1 is a vertical cross-sectional view of a semiconductor memory device embodying the present invention.
Figure 2:
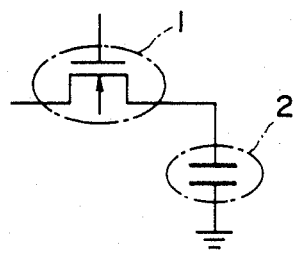
FIG. 2 is an equivalent circuit diagram of a memory cell of said semiconductor memory device.

FIG. 1 is a vertical cross-sectional view of a semiconductor memory device of the present invention; and FIG. 2 is an equivalent circuit diagram of a memory cell of said semiconductor memory device.

In FIGS. 1 and 2 there are shown an N-channel MOS transistor 1 for signal reading and recording; and a capacitor 2 for signal holding, wherein said N-channel MOS transistor 1 and capacitor 2 constitute a dynamic memory cell.

As shown in FIG. 1, the capacitor 2 is formed utilizing inner walls of a deep trench provided on a p-type silicon substrate constituting a semiconductor substrate, and is composed of said silicon substrate 14, an insulating layer 13 formed on the inner wall of the trench 13, and an electrode 7 formed in the trench. Said trench is formed for example by reactive ion etching. The electrode 7 is formed by a process for embedding polysilicon in the trench, recently developed in the VLSI technology. On the p-type silicon substrate 14, there is formed an insulating layer 12, and an insulating layer 3 is further formed after the formation of the electrode 7. On said insulating layer there is formed a nucleation base 4 composed of a different material of a silicon nucleation density higher than that of the insulating layer 3. In the present embodiment the insulating layer 3 is composed of a $SiO_2$ layer, and the nucleation base 4 is composed of a silicon nitride film. Around said nucleation base 4, there can be formed a monocrystalline or substantially monocrystalline silicon layer at a temperature of 700°–1000° C. with a gas such as $SiH_4$, $SiCl_4$ or $SiHCl_3$, with hydrogen carrier gas. Under these conditions there can be obtained a ratio $N=B/A$ equal to or higher than $10^4$, wherein A is the density of silicon nuclei formation on the insulating layer 3, and B is the density of silicon nuclei formation on the nucleation base 4. Said monocrystalline or substantially monocrystalline silicon layer, being of a polygonal shape after formation, is flattened by an integrated circuit manufacturing technology such as etch-back. Subsequently, in said monocrystalline or substantially monocrystalline silicon layer, there are formed a drain 5, a source 6, a gate insulating layer 8, a gate electrode 9 and a wiring 10, constituting the n-channel MOS transistor 1 are formed by a conventional integrated circuit manufacturing technology. The capacitor 2 and the n-channel MOS transistor 2 are connected by a through hole 11 formed in the insulating layer 3.

The n-channel MOS transistor 1 formed on the monocrystalline or substantially monocrystalline silicon layer as explained above has a channel mobility in excess of 400 cm²/VS and is comparable in performance to a conventional N-channel MOS transistor formed in a P-silicon substrate. Besides of floating capacities of the drain 5 and the source 6 of the N-channel MOS transistor 1 are much smaller than in a transistor formed in a P-type silicon substrate, so that the writing and reading speeds are significantly improved.

In the above-explained embodiment the charge holding capacitor 2 is formed in a trench formed in the P-silicon substrate 14, but it can also be a simple planar capacitor horizontally formed on the P-silicon substrate 14, or can be formed between polysilicon layers deposited on said substrate 14.

The MOS transistor for signal reading is composed of an N-channel MOS transistor in the above-explained embodiment, but it can be replaced by a P-channel MOS transistor.

In the following there will be detailedly explained a process for forming the monocrystalline or substantially monocrystalline semiconductor layer.

At first there will be explained a selective deposition process for selectively forming a deposition film on a deposition surface, utilizing the difference, between different materials, in factors influencing the nucleation in the thin film formation, such as surface energy, adhesion coefficient, dissociation coefficient, surface diffusion speed etc.

Figure 3A:
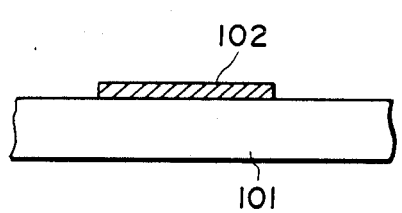
FIGS. 3A and 3B are schematic view of a selective deposition process.
Figure 3B:
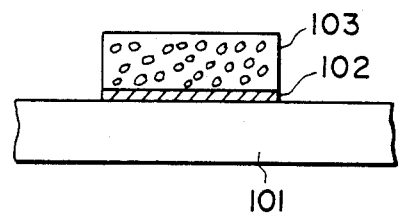

FIGS. 3A and 3B schematically illustrate the selective deposition process. At first, as shown in FIG. 3A, on a substrate 101 there is formed a thin film 102 of a material different in the abovementioned factors from said substrate 101, in a desired area. With the use of a suitable material under suitable conditions, there can be attained a phenomenon that a thin film 103 is grown on the thin film 102 only but not on the substrate 101, and this phenomenon allows to grow a self-aligned thin film 103, thereby dispensing with the conventional photolithographic process utilizing photoresist.

Examples of the materials employable in such selective deposition process are $SiO_2$ for the substrate 101, Si, GaAs or silicon nitride for the thin film 102, and Si, W, GaAs or InP for the thin film 103 to be deposited thereon.

Figure 4:
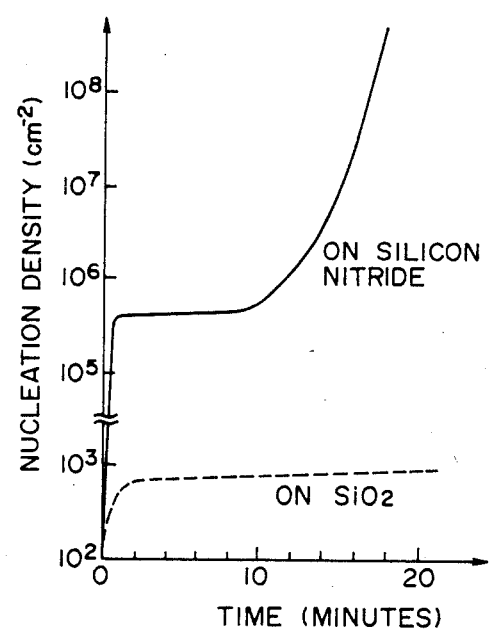
FIG. 4 is a chart showing time-dependent change in nucleation density on a $SiO_2$ surface and a silicon nitride surface.

FIG. 4 shows the time-dependent change in the nucleation density on a $SiO_2$ surface and a silicon nitride surface.

As shown in FIG. 4 the nucleation density on $SiO_2$ becomes saturated at a level under $10^3$ cm$^{-2}$ soon after the start of deposition, and the density scarcely changes even after 20 minutes from the start.

On the other hand, on silicon nitride ($Si_3N_4$), the nucleation density is once saturated at a level about $4 \times 10^5$ cm$^{-2}$ and retains said level for about 10 minutes, but rapidly increases thereafter. In this example the deposition was conducted by CVD method at a pressure of 175 Torr and a temperature of 1000° C., utilizing $SiCl_4$ gas diluted with $H_2$ gas. Also similar results can be achieved with another reaction gas such as $SiH_4$, $SiH_2Cl_2$, $SiHCl_3$ or $SiF_4$ under suitably regulated pressure and temperature. Also vacuum evaporation can be used for this purpose.

In this case the nucleation on $SiO_2$ is negligibly small, but the addition of HCl gas to the reaction gas further suppresses the nucleation on $SiO_2$, thereby completely eliminating the Si deposition on $SiO_2$. Such phenomenon is principally ascribable to the difference, between $SiO_2$ and silicon nitride, in the deposition coefficient, dissociation coefficient, surface diffusion speed etc. to silicon, but the selective deposition is also caused by a fact that silicon atoms react with $SiO_2$ to generate silicon monoxide of a high vapor pressure, thereby etching $SiO_2$ itself, whereas such etching phenomenon does not occur on silicon nitride (T. Yonehara, S. Yoshioka, S. Miyazawa Journal of Applied Physics 53, 6839, 1982).

As shown in FIG. 4, a sufficiently large difference in nucleation density can be obtained by employing $SiO_2$ and silicon nitride for the surface to be subjected to deposition, and silicon as the depositing material. Though $SiO_2$ is preferred as the material constituting the deposition surface, a difference in the nucleation density can also be obtained with $SiO_x$.

Naturally the present invention is not limited to these materials, but a difference in the nucleation density in excess of $10^3$ kis enough as shown in FIG. 4 and allows sufficient selective deposition even with the materials to be explained later.

Said difference in the nucleation density may also be obtained by local ion implantation of Si or N on $SiO_2$ for forming areas having an excess in Si or N.

Such selective deposition process can be utilized for forming a different material of a nucleation density sufficiently higher than that of the material of the deposition surface, in such a small size as to allow growth of a single nucleus and selectively growing thereon a monocrystalline or substantially monocrystalline layer only in the position of said small hetero material.

Since the selective growth of said monocrystalline or substantially monocrystalline layer is determined by the state of electrons on the deposition surface, particularly the state of dangling bonds, the material of lower nucleation density, for example $SiO_2$, need not be a bulk material but can be formed on an arbitrary material or substrate.

Figure 5A:
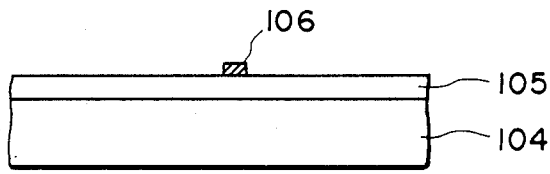
FIGS. 5A to 5D are views showing steps of an example of the process for forming the monocrystalline or substantially monocrystalline semiconductor layer.
Figure 5B:
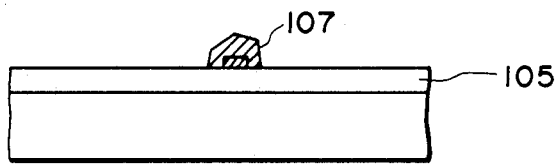
Figure 5C:
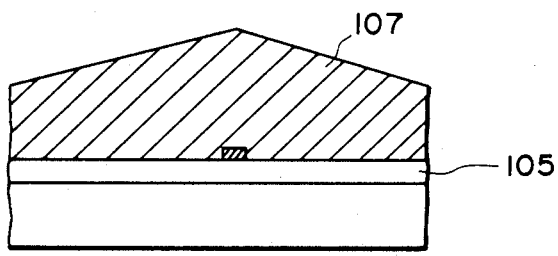
Figure 5D:
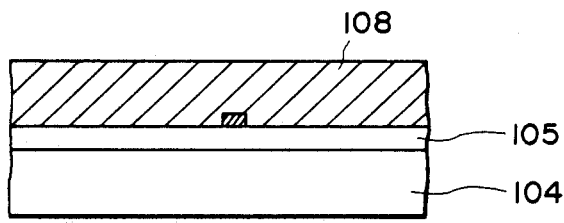
Figure 6A:
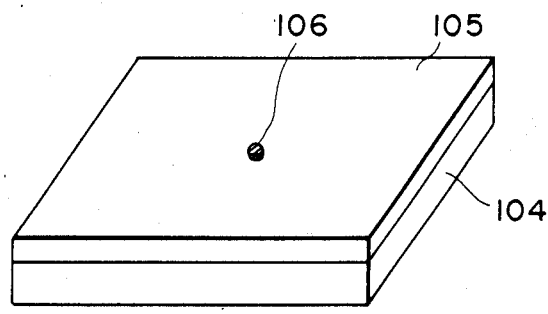
FIGS. 6A and 6B are perspective views of a substrate in the states corresponding to FIGS. 5A and 5D.
Figure 6B:
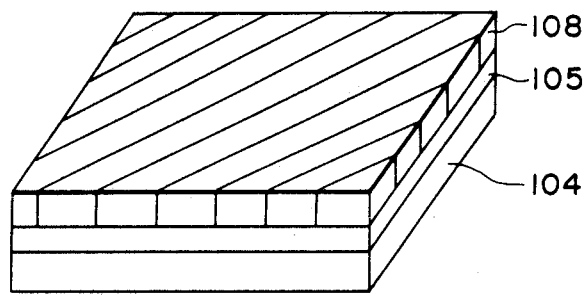

FIGS. 5A to 5D illustrate steps of an example of the process for forming said monocrystalline or substantially monocrystalline layer, and FIGS. 6A and 6B are perspective views of a substrate respectively in the steps shown in FIGS. 5A and 5D.

At first, as shown in FIGS. 5A and 6A, a thin film 105 of a low nucleation density enable selective deposition is formed on a substrate 104. Then a hetero material of a higher nucleation density is thinly deposited on said thin film 105 and patterned for example by a lithographic process in a sufficiently small size, as indicated by 106. The substrate 104 can be of arbitrary size, crystal structure and composition, and may have functional devices formed thereon. Also said hetero material 106 may be a modified area having an excess in Si or N, formed by ion implantation thereof into the thin film 105 as explained before.

Then, under suitable depositing conditions, a single nucleus of a thin film material is formed only on said hetero material 106. Stated differently, the hetero material 106 has to be formed so small as to allow formation of a single nucleus only. For this purpose, the size of the hetero material 106 should be several microns or smaller, though it depends on the material to be used. The nucleus grows, maintaining the monocrystalline or substantially monocrystalline structure, to form an island-shaped monocrystalline particle 107 as shown in FIG. 5B, and, as already explained above, complete absence of nucleation on the thin film 105 is indispensable for obtaining such particle 107.

The island-shaped monocrystalline particle 107 further grows, maintaining the monocrystalline or substantially monocrystalline structure, to eventually cover the entire thin film 105 as shown in FIG. 5C.

Subsequently the monocrystalline particle 107 is flattened by etching or lapping to obtain, as shown in FIGS. 5D and 6B, a monocrystalline layer 108 enabling formation of desired devices, on the thin film 105.

Due to the presence of the thin film 105 constituting the deposition surface, the underlying substrate 104 can be composed of an arbitrary material. Thus a monocrystalline or substantially monocrystalline layer can be easily formed even if the substrate has functional devices thereon.

In the foregoing embodiment the deposition surface is composed of a thin film 105, but it is also possible to employ a substrate composed of a material of a low nucleation density enabling selective deposition and to form a monocrystalline or substantially monocrystalline layer thereon.

[EXAMPLE]

In the following there will be explained more detailed examples of the process for forming the monocrystalline layer explained in the foregoing embodiment.

$SiO_2$ is employed as the thin film 105 constituting the deposition surface. Naturally there may be employed a quartz substrate, or a $SiO_2$ layer may be formed by sputtering, CVD or vacuum evaporation on an arbitrary substrate composed for example of metal, semiconductor, magnetic material, piezoelectric material or insulating material. Though the deposition surface is preferably composed of $SiO_2$, it may also be composed of $SiO_x$ with a different value of x.

On the $SiO_2$ layer 105 thus formed, a silicon nitride ($Si_3N_4$) layer or a polycrystalline silicon layer is deposited by gaseous growth as the hetero materials, and is patterned with an ordinary photolithographic process or a lithographic process utilizing X-ray, an electron beam or an ion beam to form the small hetero material 106 not exceeding several microns, preferably about 1 micron, in size.

Then Si is selectively grown on the substrate with a gaseous mixture of HCl, $H_2$ and $SiH_2Cl_2$, $SiCl_4$, $SiHCl_3$, $SiF_4$ or $SiH_4$, with a substrate temperature of 700°–1000° C. and a pressure of ca. 100 Torr.

Within a period of several tens of minutes, a monocrystalline silicon particle 107 grows around the small hetero material 106 composed of silicon nitride or polycrystalline silicon on $SiO_2$, even to a size of several tens of microns under optimum conditions.

Subsequently reactive ion etching (RIE) having an etch rate difference between Si and $SiO_2$ is conducted to flatten silicon by etching thereof, thereby obtaining a polycrystalline silicon layer of controlled particle size. Then the particle boundary portions are removed to obtain an island-shaped monocrystalline silicon layer 108. If the monocrystalline particle 107 has an irregular surface, the etching is conducted after mechanical lapping.

Thus formed monocrystalline silicon layer 108, of several tens of microns in size and free from particle boundaries, enables formation of field effect transistors comparable in performance to those formed on a monocrystalline silicon wafer.

Also it is electrically separated by $SiO_2$ from the neighboring monocrystalline silicon layer 108, so that CMOS transistors formed therein are free from mutual interference. Besides, as the active layer of the device is thinner than that formed in a silicon wafer, it is possible to prevent erroneous operation caused by a charge induced by an irradiation. Furthermore a lower parasite capacitance allows to realize a higher operating speed of the device. Also the possibility of using an arbitrary substrate allows to form the monocrystalline layer on a larger substrate with a lower cost than in case of silicon wafer. Furthermore it is rendered possible to obtain a multi-functional three-dimensional integrated circuit, as the monocrystalline layer can be formed on a substrate composed of a semiconductive material, a piezoelectric material or a dielectric material.

[COMPOSITION OF SILICON NITRIDE]

A sufficiently large difference in the nucleation density between the material constituting the deposition surface and the hetero material, as explained before, can be obtained not only with $Si_3N_4$ but also with silicon nitride of different composition.

In the formation of the silicon nitride film with plasma CVD by decomposing $SiH_4$ gas and $NH_3$ gas in RF plasma at a low temperature, the ratio of Si to N in the deposited silicon nitride film can be significantly varied by a change in the flow rate ratio of $SiH_4$ gas and $NH_3$ gas.

Figure 7:
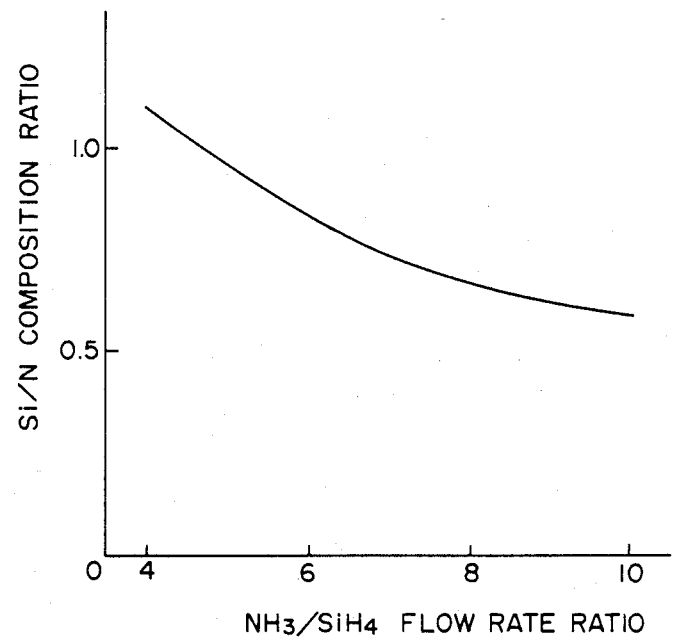
FIG. 7 is a chart showing the composition ratio of Si and N in a formed silicon nitride film as a function of flow rate ratio of $SiH_4$ and $NH_3$.

FIG. 7 shows Si/N composition ratio in the deposited silicon nitride film as a function of the flow rate ratio of $SiH_4$ and $NH_3$.

In this example the deposition was conducted with an RF output of 175W and a substrate temperature of 380° C., and with a fixed flow rate of $SiH_4$ gas at 300 cc/min and a varying flow rate of $NH_3$ gas. In response to a change in the $NH_3/SiH_4$ flow rate ratio from 4 to 10, the Si/N ratio in the silicon nitride film, determined by electron spectroscopy shows a change from 1.1 to 0.58.

On the other hand, a silicon nitride film formed with a reduced pressure CVD process by introducing $SiH_2Cl_2$ gas and $NH_3$ gas at a pressure of 0.3 Torr and a temperature of ca. 800° C. showed a composition close to the stoichiometric ratio of $Si_3H_4$ (Si/N=0.75).

Also a silicon nitride film formed by thermal treatment of Si with ammonia or $N_2$ at ca. 1200° C. (thermal nitrization) showed a composition even closer to the stoichiometric ratio, as the film formation was achieved under thermal equilibrium.

Such silicon nitrides obtained in various processes, when used in silicon nuclei grow as the hetero material of a higher nucleation density, provides a nucleation density variable according to the composition ratio.

Figure 8:
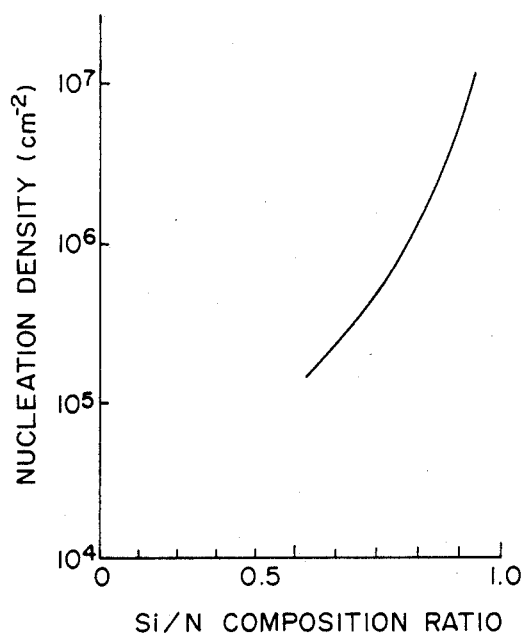
FIG. 8 is a chart showing the nucleation density as a function of Si/N composition ratio.
Figure 9:
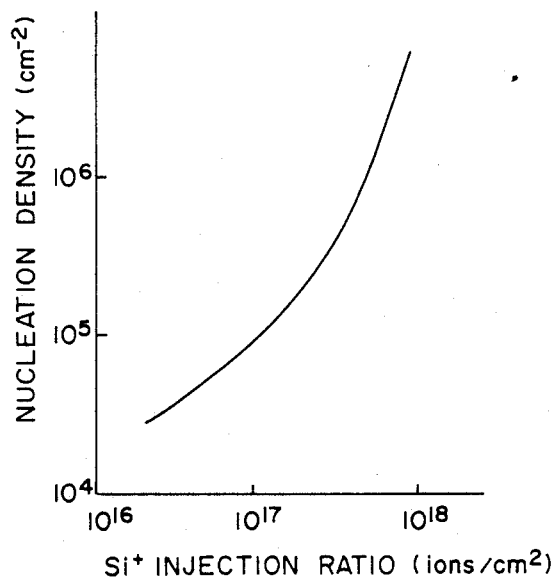
FIG. 9 is a chart showing the nucleation density as a function of the amount of implanted Si ions.

FIG. 8 shows the nucleation density as a function of the Si/N composition ratio. As shown in FIG. 9, a change in the composition of silicon nitride film significantly varies the density of silicon nuclei developed thereon. The Si nucleation was conducted by reacting $SiCl_4$ of 175 Torr with $H_2$ at 1000° C.

This phenomenon of the change in the nucleation density as a function of the composition of silicon nitride influences the size of silicon nitride formed sufficiently small for growing a single nucleus. Stated differently, silicon nitride of a composition of a large nucleation density cannot grow a single nucleus unless the particle is formed very small.

It is therefore necessary to select the nucleation density and the optimum size of silicon nitride allowing single nucleus formation. For example, under depositing conditions providing a nucleation density of ca. $10^5$ cm$^{-2}$, single nucleus formation can be achieved if the size of silicon nitride is ca. 4 μm or smaller.

[FORMATION OF HETERO MATERIAL BY ION IMPLANTATION]

A difference in nucleation density to Si can also be realized by local ion implantation of Si, N, P, B, F, Ar, He, C, As, Ga, Ge etc. on the surface of SiO$_2$ constituting a deposition surface of low nucleation density to form modified areas thereon, and utilizing said modified areas as the deposition surface of high nucleation density.

As an example, the surface of SiO$_2$ is covered with photoresist, and is partially exposed to the outside by an exposure and a development of the photoresist in said areas.

Then Si ions are implanted, from SiF$_4$ source gas, into the SiO$_2$ surface with a voltage of 10 keV and with a density of $1 \times 10^{16}$ to $1 \times 10^{18}$ cm$^{-2}$. The projection stroke is 114 Å, and the Si concentration at the SiO$_2$ surface reaches as high as ca. $10^{23}$ cm$^{-2}$. The ion implanted area is amorphous as SiO$_2$ is originally amorphous.

The modified area can be obtained by ion implantation utilizing photoresist as explained above, or by ion implantation of Si ions onto the SiO$_2$ surface with a concentrated ion beam and without photoresist.

After such ion implantation, the photoresist is removed to obtain a modified area with an excess in Si, on the SiO$_2$ surface. Then silicon is grown in gaseous phase on the SiO$_2$ deposition surface, having such modified areas.

FIG. 9 shows the nucleation density as a function of the amount of implanted Si ions. As shown in FIG. 9, the nucleation density increases with the increase in the amount of implanted Si ions.

It is therefore possible to grow a single silicon nucleus on said modified area, functioning as the hetero material, by forming said modified area sufficiently small, and therefore to grow a single crystal as explained above.

A sufficiently small modified area allowing a single nucleus growth can be easily obtained by a patterning with photoresist or by concentration the ion beam.

[SILICON DEPOSITION OTHER THAN CVD]

Monocrystalline growth by selective silicon nucleus formation can be achieved not only by CVD process but also by evaporating silicon with an electron gun in vacuum ($<10^{-6}$ Torr) and depositing on a heated substrate. Particularly in molecular beam epitaxy (MBE) utilizing evaporation in ultra high vacuum ($<10^{-9}$ Torr) it is known that the Si beam and SiO$_2$ start to react at a substrate temperature of 900° C. or higher to completely eliminate Si nucleation on SiO$_2$ (T. Yonehara, S. Yoshioka and S. Miyazawa, Journal of Applied Physics 53, 10, p. 6839, 1983).

This phenomenon could be utilized in forming a single silicon nucleus with complete selectivity in each of scattered small silicon nitride areas on SiO$_2$ and growing monocrystalline silicon thereon. The deposition was conducted under vacuum of $10^{-8}$ Torr or lower, a Si beam intensity of $9.7 \times 10^{14}$ atoms/cm$^2$ sec and a substrate temperature of 900° to 1000° C.

In this case a reaction SiO$_2$+Si→2SiO ↑ generates a reaction product SiO with a very high vapor pressure, with the resulting etching of SiO$_2$ itself by Si.

On the other hand, silicon nitride does not cause such etching but allows nucleation and deposition thereon.

Consequently similar results can be obtained with tantalum oxide (Ta$_2$O$_5$) or silicon oxynitride (SiON) instead of silicon nitride, as the material of high nucleation density. More specifically, similar monocrystalline growth can be achieved by forming these materials in small forms as the hetero material explained above.

The above-explained single crystal growing process enables formation of a semiconductor crystal layer on an insulating layer.

The above-explained embodiment allows to form an insulating layer on a charge holding capacitor, to form a monocrystalline or substantially monocrystalline semiconductor layer on said insulating layer and to a transistor thereon, thereby obtaining a memory device of a large capacity and a high degree of integration.

Also the above-explained embodiment allows to reduce the floating capacity of the transistor, thereby significantly reducing the reading and writing speeds and improving the performance.

What is claimed is:
1. A semiconductor memory device comprising:
   a charge holding capacitor formed on a semiconductor substrate;
   an insulating layer formed on said capacitor; and
   a transistor formed on a monocrystalline or substantially monocrystalline semiconductor layer which is provided by forming, on said insulating layer, a hetero material of a nucleation density sufficiently higher than that of said insulating layer and of a size small enough to allow growth of a single nucleus of a semiconductor layer, followed by crystal growth around a single nucleus formed on said hetero material.

* * * * *